United States Patent [19]

Matloubian et al.

[11] Patent Number: 5,757,074
[45] Date of Patent: May 26, 1998

[54] MICROWAVE/MILLIMETER WAVE CIRCUIT STRUCTURE WITH DISCRETE FLIP-CHIP MOUNTED ELEMENTS

[75] Inventors: Mehran Matloubian, Encino; Perry A. Macdonald, Culver City; David B. Rensch, Thousand Oaks, all of Calif.; Lawrence E. Larson, Bethesda, Md.

[73] Assignee: Hughes Electronics Corporation, El Segundo, Calif.

[21] Appl. No.: 681,688

[22] Filed: Jul. 29, 1996

Related U.S. Application Data

[62] Division of Ser. No. 499,800, Jul. 7, 1995, Pat. No. 5,629,241.
[51] Int. Cl.$^6$ ............................................. H01L 23/14
[52] U.S. Cl. ................... 257/702; 257/725; 257/728; 257/778
[58] Field of Search ............................. 257/778, 702, 257/725, 728

[56] References Cited

U.S. PATENT DOCUMENTS 5,510,758  4/1996  Fujita et al. ........................ 257/778

FOREIGN PATENT DOCUMENTS

| | | |
|---|---|---|
| 0 035 093 A | 9/1981 | European Pat. Off. . |
| 0 517 247 A | 12/1992 | European Pat. Off. . |
| 0 383 292 A | 8/1990 | France . |
| 2 710 195 A | 3/1995 | France . |

OTHER PUBLICATIONS

Kuno, H.J., et al. "Designing A 100 MHZ Sparc Dual Processor Using MCM-L Packaging Technology and Microwave Design Techniques" 1994 IEEE MTT-S International Microwave Symposium Digest vol. 3, pp. 1715-1718.

H. Sakai et al., "A Novel Millimeter-Wave IC on Si Substrate Using Flip-Chip Bonding Technology", *IEEE MTT-S Digest*, 1994, pp. 1763-1766.

*Primary Examiner*—Tom Thomas
*Assistant Examiner*—Roy Potter
*Attorney, Agent, or Firm*—V. D. Duraiswamy; W. K. Denson-Low

[57] ABSTRACT

A microwave/millimeter wave circuit structure supports discrete circuit elements by flip-chip mounting to an interconnection network on a low cost non-ceramic and non-semiconductor dielectric substrate, preferably Duroid. The necessary precise alignment of the circuit elements with contact pads on the substrate network required for the high operating frequencies is facilitated by oxidizing the interconnection network, but providing the contact pads from a non-oxidizable material to establish a preferential solder bump wetting for the pads. Alternately, the contact bumps on the flip-chips can be precisely positioned through corresponding openings in a passivation layer over the interconnection network. For thin circuit substrates that are too soft for successful flip-chip mounting, stiffening substrates are laminated to the circuit substrates. In a self-contained antenna application in which two of the circuit substrates are laminated together, with an antenna on one side and circuitry on the other side, a metallic ground plane between the substrates also serves a stiffening function.

6 Claims, 4 Drawing Sheets

MICROWAVE/MILLIMETER WAVE CIRCUIT STRUCTURE WITH DISCRETE FLIP-CHIP MOUNTED ELEMENTS

This is a division of application Ser. No. 08/499,800 filed Jul. 7, 1995, now U.S. Pat. No. 5,629,241.

BACKGROUND OF THE INVENTION

1. Field of the Invention

This invention relates to microwave/millimeter wave circuits, and more particularly to circuit structures in this wavelength range that employ discrete circuit elements.

2. Description of the Related Art

The microwave/millimeter wave spectrum is generally defined as extending from about 1 m at 300 MHz to about 1 mm at 300 GHz, with the millimeter wave portion of the spectrum covering about 30–300 GHz.

Microwave/millimeter wave circuits have been developed for numerous applications, such as telephone transmission, microwave ovens, radar, and automotive uses that include collision warning radar, millimeter wave imaging systems, blind-spot radar, toll exchanges and radar for monitoring road surfaces. They have generally been implemented as either hybrid circuits, with discrete elements wire bonded to a circuit board substrate, or as monolithic microwave integrated circuits (MMICs) in which active circuit components are integrated on the same wafer as passive components. While the development of microwave devices such as collision warning radars has been based upon the use of MMICs, several factors make the fabrication of MMICs considerably more expensive than fabricating discrete devices.

MMICs are much larger than discrete devices and accordingly take up a larger area of the semiconductor wafer; the cost of a chip depends heavily upon its size. Also, due to the complexity of fabricating MMICs, their typical yield is on the order of 15%–30%, as opposed to yields of more than 80% that can easily be achieved with discrete devices. For example, from a 7.6 cm (3 inch) wafer it is possible to obtain approximately 14,000 working discrete devices, as compared to approximately 400 MMICs.

The use of flip-chip bonding techniques, in which conductive contact "bumps" are provided on the circuit face of a chip which is "flipped" and both electrically and mechanically affixed to a circuit board via the bumps, is disclosed in H. Sakai et al., "A Novel Millimeter-Wave IC on Si Substrate Using Flip-Chip Bonding Technology", *IEEE MTT-S Digest*, 1994, pages 1763–1766. In this publication, millimeter wave heterojunction transistors are flip-chip bonded to microstrip lines formed on a silicon substrate. However, silicon has very high losses at millimeter wave frequencies. To overcome these losses, Sakai et al. deposited 9 micrometer thick $SiO_2$ on the silicon substrate to use in the fabrication of microstrip transmission lines. However, the loss for 50 ohm transmission lines at 60 GHz was still 0.55 dB/mm, which is too high for low-loss matching elements, power combiners and couplers. In fact, the circuit that was reported to have been constructed for testing operated at 20 GHz rather than 60 GHz, presumably because of excessive transmission line losses at the higher frequency. Furthermore, silicon as well as the ceramic materials that are conventionally used for circuit boards at lower frequencies are relatively expensive.

Sakai et al. also proposed a bump technology that is based upon the use of an insulate resin with no heating. This results in a relatively low accuracy of device placement, which is a critical factor at the high frequencies involved in microwave/millimeter wave circuits. In fact, a primary reason for the movement towards MMICs as opposed to hybrid circuits is the high cost of hybrid circuits that results from the need to hand tune each circuit; this process is both time consuming and expensive. The higher the frequency, the smaller is the length of matching elements (transmission lines), and the more sensitive is the circuit performance to variations in the line lengths and device placement. Flip-chip mounting has been primarily used at lower frequencies, at which slight variations in the device mounting location is not important to the circuit performance. In the microwave/millimeter wave range, however, the accuracy of device placement and attachment is highly important to the achievement of low cost circuits and systems. Sakai et al. achieved a chip alignment accuracy of 5.5 micrometers for transmission line widths of only 16 micrometers; such a low placement accuracy with respect to the line width is believed to be unacceptable at millimeter wave frequencies for achieving reproducible circuit performance.

In contrast to the relatively high loss and expensive silicon substrate employed by Sakai et al., Duroid substrates or other similar plastic type substrates have been developed which have both a lower cost and a lower loss level. Duroid is a trademark of Rogers Corporation for a doped Teflon® composition (the chemical formula for Teflon is PTFE). Low-loss plastic type substrates are available inexpensively with metalization on both sides, and do not require the deposition of $SiO_2$ and the two metal layers of Sakai et al. to fabricate low-loss transmission lines. However, Duroid substrates are relatively soft and it is therefore difficult to wire bond discrete devices onto them. At lower frequencies these substrates are used for microwave circuits that employ previously packaged components, such as discrete transistors that are wire bonded inside a package which in turn is mounted on the Duroid substrate. However, the package parasitics of the components are too high for this approach to work at millimeter wave frequencies. Also, up to a thickness of about 600 micrometers Duroid substrates are too flexible for reliable automated flip-chip mounting; MMICs are therefore conventionally flip-chip mounted on very hard substrates, such as alumina. Thus, despite their desirable low cost, Duroid substrates have not been suitable for flip-chip mounting of high frequency MMICs.

SUMMARY OF THE INVENTION

The present invention seeks to provide a microwave/millimeter wave circuit structure and related fabrication method that is less expensive and achieves a higher yield than presently available MMIC techniques, and yet avoids the excessive losses, lack of accuracy in device placement with respect to line width, and relatively high substrate cost of the Sakai et al. approach.

These goals are achieved with a microwave/millimeter wave circuit structure that employs a non-ceramic and non-semiconductor dielectric substrate, preferably a low-loss plastic, in which discrete circuit elements are flip-chip mounted to the substrate and electrically interconnected by an interconnection network on the substrate. The spacings between the interconnected circuit elements are compatible with electrical signals in the microwave/millimeter wave range, and a highly accurate device placement that avoids the need for hand tuning is achieved through the use of solder bumps on the chips that self-align with contact pads on the substrate.

In a preferred embodiment the surface of the interconnection network is oxidized, while the substrate contact pads are formed from a non-oxidyable material, preferably nickel/gold. The oxidized surface inhibits a flow of the solder bumps onto it, thereby enhancing an accurate self-alignment of the bumps and their associated circuit elements on the substrate pads. To optimize performance at millimeter wave frequencies, the spacings between adjacent bumps are less than about 125 micrometers, and the pad widths are no greater than about 50 micrometers. As an alternate way to enhance the accuracy of the circuit element placement, the substrate may be coated with a passivation layer in which openings are formed at the bump locations, with the bumps extending through respective openings to contact the underlying interconnection network.

To provide the requisite rigidity for plastic substrates that are thinner than approximately 600 micrometers, a low cost stiffening substrate is preferably adhered to the principal substrate. A compact transceiver device can be implemented by laminating two Duroid substrates back-to-back, with one of the substrates bearing a transceiver circuit and the other an antenna that communicates with the transceiver circuit through the substrates and preferably has a lower dielectric constant than the circuit substrate. A metal layer between the two substrates serves the dual function of a ground plane and a stiffening layer; a separate stiffening substrate may also be provided over the flip-chip circuitry.

These and other features and advantages of the invention will be apparent to those skilled in the art from the following detailed description, taken together with the accompanying drawings.

DETAILED DESCRIPTION OF THE INVENTION

The invention improves upon the reliability and cost of microwave/millimeter wave circuits by flip-chip mounting discrete active circuit elements to a novel substrate for this purpose. The invention overcomes the critical alignment problems that would otherwise be expected to be an inhibiting factor in this high frequency range.

Figure 1:
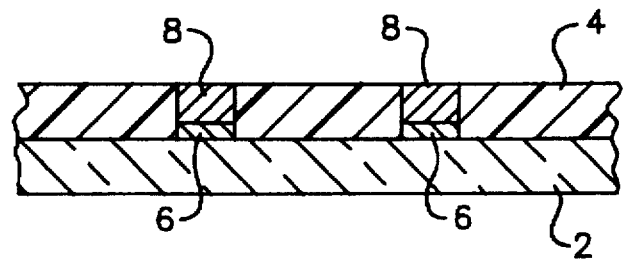
FIGS. 1, 2 and 3 are fragmentary sectional views illustrating sequential steps in the fabrication of bump contacts on a flip-chip circuit.
Figure 2:
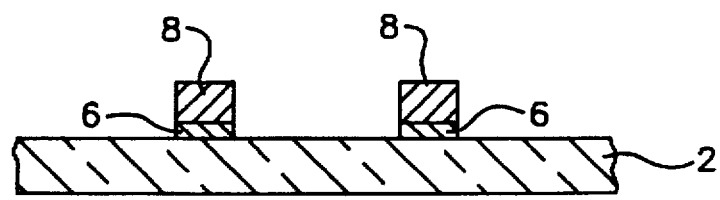
Figure 3:
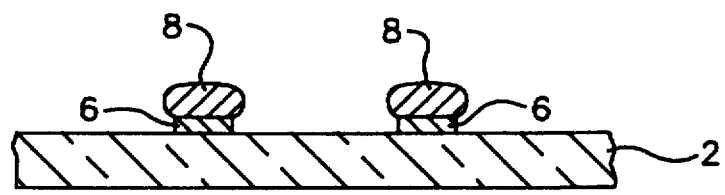

FIGS. 1–3 illustrate the formation of bonding pads on a flip-chip device. In FIG. 1 a flip-chip 2 that is formed from a semiconductor such as InP or GaAs is shown with its circuit side facing up, although the circuit itself is not illustrated in the figure. The circuit side of the chip is coated with a photoresist 4 that is patterned with openings within which contact pads 6 are formed in contact with the circuit. With Au used for the circuit interconnections, the pads are typically formed from Ti/Pt/Au or Ni/Au.

Solder contact "bumps" (made from alloys such as tin/lead) 8 are then plated up in the upper portion of the photoresist opening. While contact bumps per se are not new and are disclosed, for example, in Sakai et al., supra, the accuracy with which solder bump devices can be mounted to a substrate is inadequate for microwave/millimeter wave circuitry. The invention provides a more accurate device placement that permits alignment accuracy on the order of approximately 2 micrometers (with a transmission linewidth of 125 micrometers) without any need for lengthy alignment by an automated system.

Once the solder bumps 8 have been plated up, the photoresist is removed as shown in FIG. 2. For compatibility with microwave/millimeter wave frequencies, the bumps are typically 25 micrometers high and 50 micrometers wide, and in any event no more than about 100 micrometers wide, and the spacing between adjacent bumps on a given device are kept to typically about 150 micrometers. This contrasts with typical prior flip-chip bump dimensions of 75 micrometers high and wide, and 250–375 micrometer between adjacent bumps.

Figure 4:
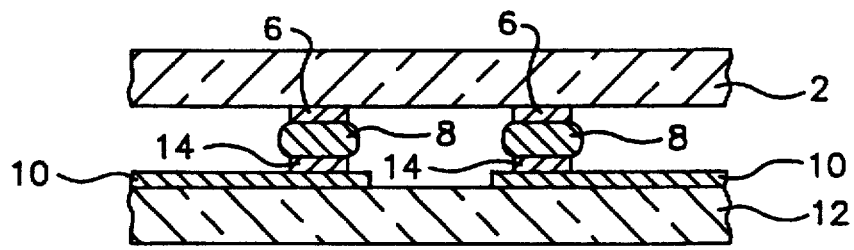
FIG. 4 is a fragmentary sectional view illustrating the flip-chip mounted on an interconnection substrate.

After removal of the photoresist the bumps 8 are preflowed to give them a somewhat flattened contour, as illustrated in FIG. 3. A preflow temperature of 220° C. is suitable for tin lead solder. The chip is then flipped over and mounted to a special substrate 12 that has unique characteristics as described below. The substrate carries a metallized interconnection network on its upper surface, typically a patterned copper network of which a pair of leads 10 are shown in FIG. 4. Pads 14 are provided on the substrate metallization at the desired contact sites; the substrate pads 14 will generally be similar to the chip pads 6. When the chip has been put in place, the solder pads 8 are heated and reflowed so that they adhere to, and form electrical contacts with, the substrate pads 14. The necessary heat can be provided by conventional techniques such as placing the assembly in a convection oven, flowing hot gas onto the chip or the use of a heat lamp. During the heating process the solder's surface tension tends to make the bumps self-align with the substrate pads 14. This is helpful in obtaining the necessary high placement accuracy.

Figure 5:
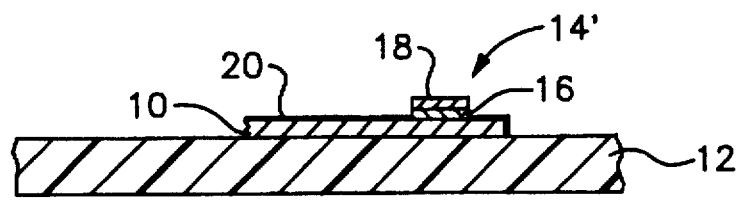
FIGS. 5 and 6 are respectively fragmentary sectional and plan views of an interconnection substrate with an oxidized lead which bears a non-oxidized bump contact pad.
Figure 6:
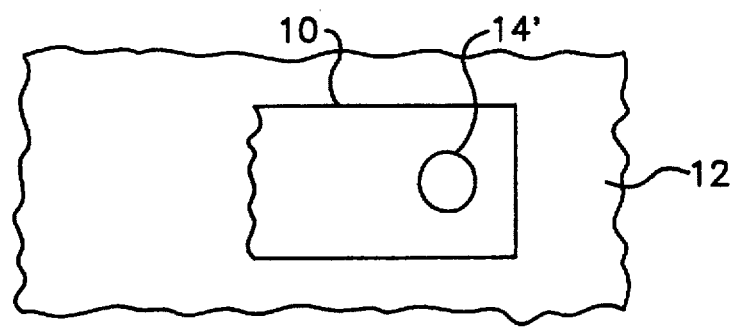

The placement accuracy is further improved by combining an oxidizable substrate metallization with a non-oxidizable contact pad on that metallization. This structure is illustrated in FIGS. 5 and 6. The substrate metallization 10 is formed from a conventional material such as copper, while the contact pad 14' is formed from a material that does not oxidize (or that oxidizes at a substantially higher temperature than the metallization). A nickel layer 16 covered by a gold layer 18 is preferred for this purpose; successive titanium, platinum and gold layers could also be used. The substrate is heated to form an oxide layer 20 over the metallization 10, but not over the contact pad 14'. When the solder bump is then reflowed onto the substrate contact pad 14', the surrounding metallization oxide 20 prevents the solder from flowing onto the metallization, since the oxide presents a non-wettable surface to the solder. The pad thus presents a preferential wettable surface for the solder which enhances the self-alignment of the solder bump to the pad, and thus the precision of the flip-chip placement on the substrate. A suitable tin lead solder reflow temperature range is 180°–250° C.

Figure 7:
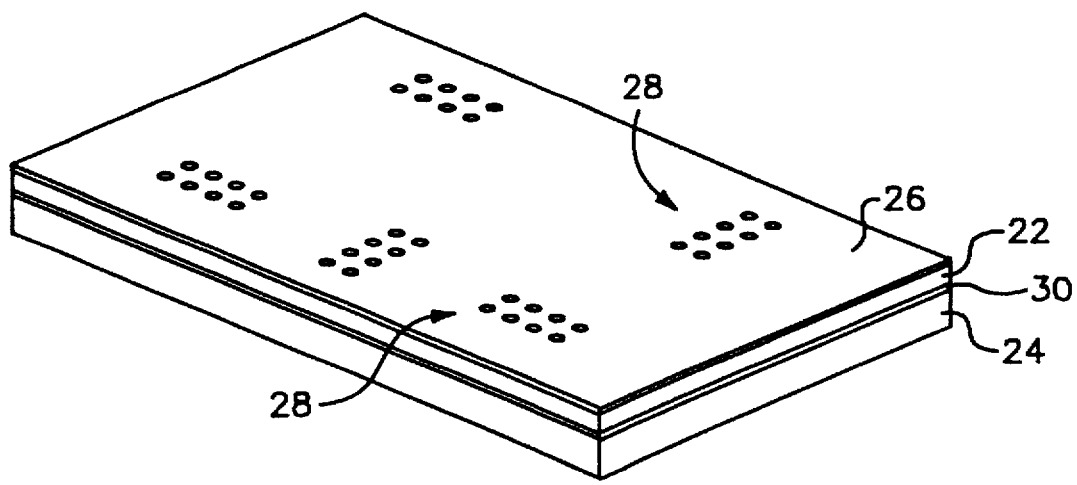
FIG. 7 is a perspective view of a circuit substrate in accordance with the invention that includes a passivation layer with bump contact openings and a stiffening backing.
Figure 8:
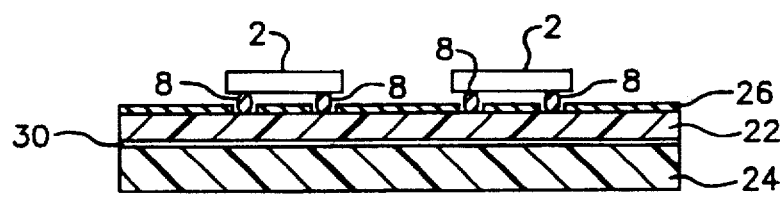
FIG. 8 is a sectional view of a circuit substrate as in FIG. 7, with a pair of circuit chips flip-chip mounted to the substrate.

An alternate approach to assuring precise device placement is illustrated in FIGS. 7 and 8. The substrate in this embodiment is a relatively thin layer 22 of a non-ceramic and non-semiconductor dielectric material that provides special advantages and is discussed in greater detail below, backed by a stiffening substrate 24. The overall substrate is coated with a thin passivation layer 26, preferably a polyimide, that adheres to the substrate 22. Arrays of small openings 28 are formed through the passivation layer, corresponding to the desired locations for the contact bumps 8 of the various flip-chips 2. The openings 28 are only slightly larger than the contact bumps, thus assisting in a precise alignment between the bumps and the metallization (not shown) on substrate 22 that underlies the passivation layer 26. This type of passivation layer has been used previously with flip-chips, but not to provide the high precision device placements required for microwave/millimeter wave operation.

The primary substrate 22 upon which the interconnection network is formed for the various flip-chips consists of a non-ceramic and non-semiconductor dielectric material, preferably Duroid. As mentioned above, Duroid is inexpensive but has generally been considered too flexible for flip-chip applications. The invention attains the low cost benefits of a low-cost plastic substrate, but modifies the substrate structure so that it is compatible with flip-chip technology. Such modification is necessary for substrate thicknesses less than about 600 micrometers, at which Duroid normally does not have sufficient rigidity for flip-chip mounting. Other low cost materials that are similarly not ordinarily considered for flip-chip applications, such as composite resin based materials, could be used instead of Duroid, although Duroid is the most preferred.

For Duroid substrates that are too thin for flip-chip mounting, a stiffening substrate 24 is provided from a material that is separated from the electrical circuitry by the Duroid substrate 22, and therefore does not have to have the electrical properties normally associated with a flip-chip mounting substrate. This opens up a wide range of potential materials that can be used for the stiffener substrate, with the particular material selected for any given application generally depending on its cost, its stiffness properties and whether it will provide some electrical function for the device. Preferred stiffening substrates for this purpose are FR4, an industry standard plastic commonly used for the fabrication of surface boards, and polyimides. The Duroid and stiffener substrates are preferably laminated together through a heat/pressure process with a glue bond 30 between them. The lamination temperature will generally be about 250°–300° C.

Figure 9:
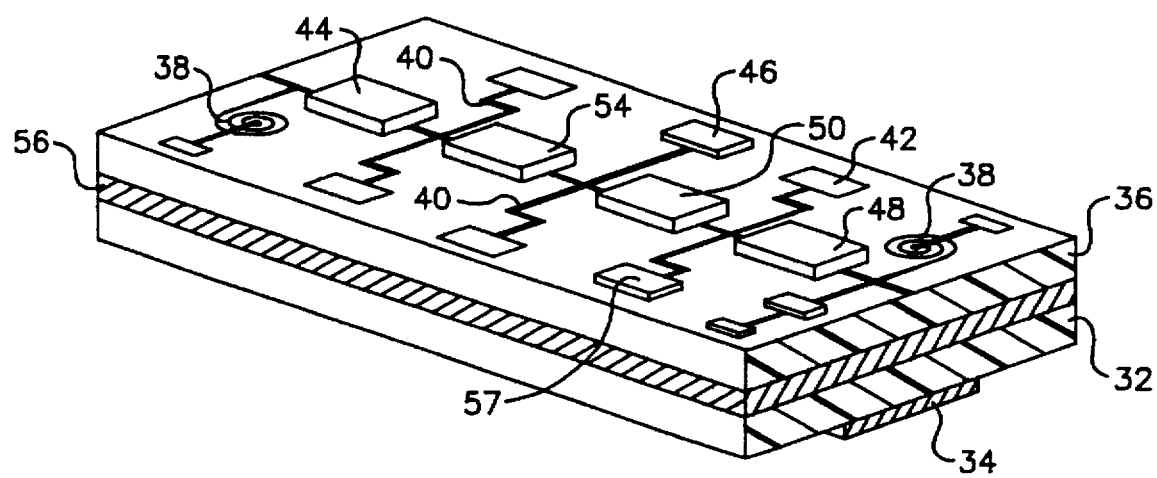
FIG. 9 is a perspective view of a dual substrate configuration with a flip-chip transceiver circuit on one side and an antenna on the opposite side.

FIG. 9 shows another application of the invention, in which two Duroid substrates are laminated together to form a double-sided high frequency device, with circuit elements on opposite faces. Passive circuit elements, such as transmission lines, bias circuits, antennas and power combiners, can be fabricated directly on one or both substrates at low cost. The fabrication of such passive circuit elements does not require very fine geometries and lithography steps, and as a result can be mass produced at low cost. Discrete active elements such as transistors, varactors, PIN-switches and diode mixers, as well as other passive components such as capacitors and resistors, can be added to one or both low cost substrates using flip-chip technology. In the example shown in FIG. 9, one of the substrates 32 bears an antenna 34, while the other substrate 36 bears transceiver circuitry associated with the antenna. This circuitry includes passive elements such as inductors 38, transmission lines 40 and contact pads 42 formed directly on the substrate, active elements such as a power HEMT (high electron mobility transistor) 44, varactor 46, low noise HEMT 48, HBT (heterojunction bipolar transistor) 50 and PIN diode 52 secured by flip-chip mounting, and additional passive elements such as capacitor 54 and resistor 57 that are also secured by flip-chip mounting.

A ground plane 56, preferably copper, separates the two substrates. The ground plane is preferably formed from copper and is patterned with an array of openings 58 (see FIG. 10) at the locations where communication between the transceiver circuitry and the underlying antenna is desired; the high frequency signals are transmitted between the antenna and its associated circuitry via the continuous dielectric paths that include these openings in the ground plane.

Figure 10:
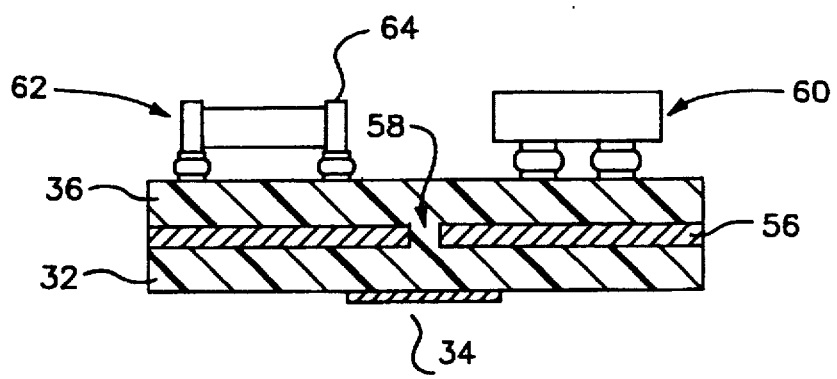
FIG. 10 is an illustrative sectional view showing a flip-chip and a beam lead chip mounted to the structure of FIG. 9.

FIG. 10 shows only one illustrative flip-chip package 60 mounted to corresponding pads on the upper substrate 36. Also shown is a beam lead package 62, which is a conventional circuit package that is similar to a flip-chip but employs a conductive ring 64 around its edge rather than contact bumps on its under circuit surface. Beam lead devices are mounted in a manner similar to flip-chips, and for purposes of the invention can be considered to be equivalent to flip-chips.

Figure 11:
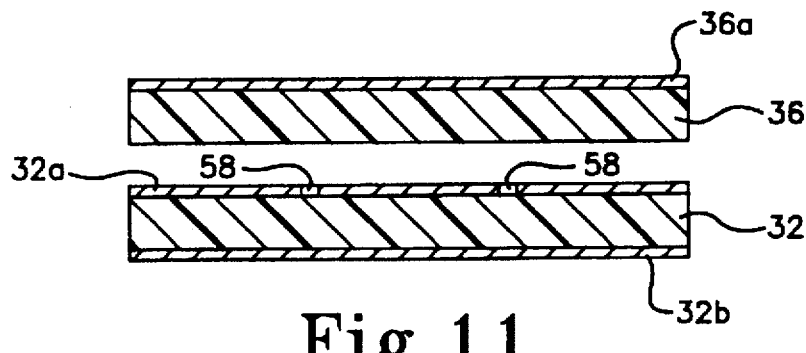
FIG. 11 is a sectional view of two substrates used in the formation of the dual substrate structure of FIG. 9.

FIG. 11 shows the two Duroid substrates 32 and 36 before they are laminated together. Such substrates are conventionally provided with metallization layers on both faces; the upper and lower metallization layers on substrates 32 and 36 are identified respectively as 32a, 32b and 36a. Prior to laminating the two substrates together, metal layer 36b is etched away. The antenna 34 is patterned from metallization layer 32b, the interconnection network for the transceiver circuitry is patterned from metallization layer 36a, and the inner metallization layer 32a is fused to the non-metallized surface of the substrate 36 to form the ground plane 56. Prior to joining the two substrates, ground plane openings 58 are formed in the metallization layer 32a. The bonding film (typically PTFE Bonding film) fills these openings during the fusion process.

In addition to functioning as a ground plane, the fused metallizations 32a and 36b stiffen the overall substrate and allow it to be thinner than would otherwise be the case in the absence of a stiffening substrate as shown in FIGS. 7 and 8. However, if additional stiffness is required, a stiffening substrate can be added over the circuit substrate 36, with cavities left in the stiffening substrate for the various electrical components.

The two substrates 32 and 36 can also be fabricated with different dielectric constants, if desired. For a self-contained antenna application, a lower dielectric constant for the antenna substrate 32 will help to prevent the field radiated from the antenna from being confined in the substrate, while a higher dielectric constant for the circuit substrate 36 will reduce the required length of its transmission lines. Duroid-type materials with different dielectric constants are readily available.

Figure 12:
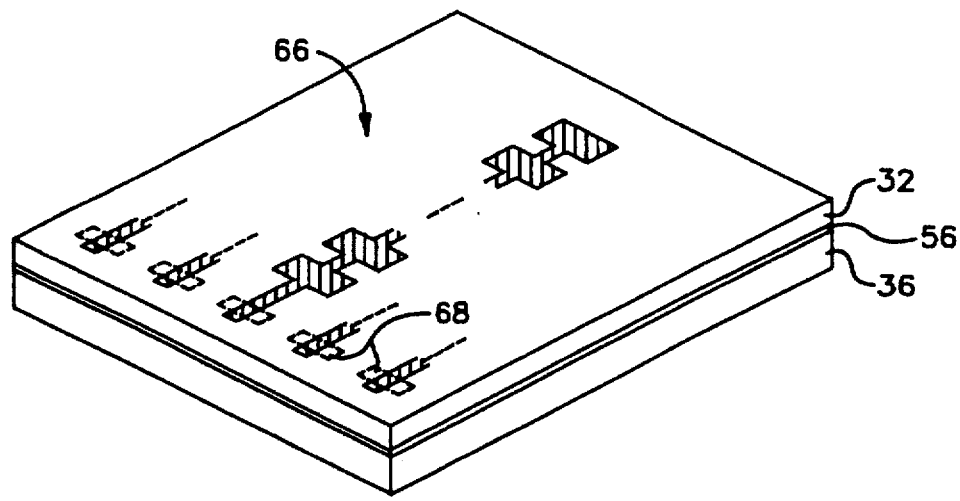
FIG. 12 is a perspective view showing the antenna side of a dual antenna/circuit substrate.
Figure 13:
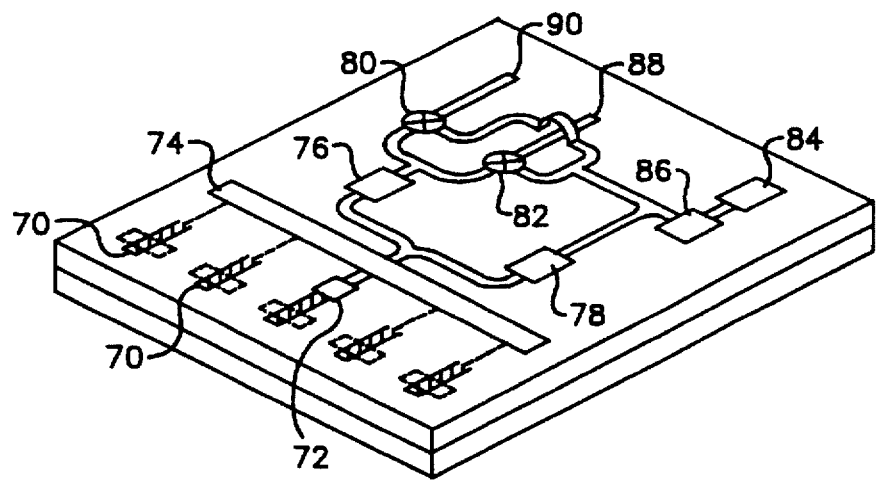
FIG. 13 is a perspective view showing the circuit side of the FIG. 12 structure.

FIGS. 12 and 13 show a particular implementation of the self-contained antenna device illustrated in FIG. 9, with the antenna array 66 shown in FIG. 12 and the circuitry on the opposite face in FIG. 13. The substrates in this particular case are about 7.5×10 cm, with the antenna and circuit substrates 32 and 36 respectively 125 and 250 micrometers thick; all of these dimensions can vary depending upon the particular application. Each antenna communicates with the transceiver circuitry on the opposite side through openings (not shown) in the ground plane 56 that are aligned with the antenna input end 68a.

The transceiver circuit on the opposite side, shown in FIG. 13, includes five terminals 70 that communicate with different respective antennas on the opposite side of the substrates, and PIN diode switches 72 that provide switched connections between the terminals 70 and a 5:1 power combiner 74. The power combiner is connected in turn to amplifiers 76 and 78, with amplifier 76 providing a signal between mixers 80 and 82. A voltage controller oscillator (VCO) 84 supplies a reference frequency signal to a frequency doubler 86, the output of which is connected along with amplifier 78 to the mixers 80 and 82. The opposite mixer terminals from amplifier 76 are the in-phase (I) channel 88 and the quadrature (Q) channel 90. This type of antenna is particularly useful in automotive applications such as collison warning radar.

The invention provides low cost, high reliability circuit structures for microwave and millimeter wave applications, without the undesirable parasitic effects of prior high frequency structures. While particular embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A microwave/millimeter wave circuit structure, comprising:

a non-ceramic and non-semiconductor dielectric substrate, an electrical interconnection network on said substrate, and a plurality of discrete circuit elements flip-chip mounted to said substrate and electrically interconnected by said interconnection network, with spacings between the interconnected circuit elements compatible with electrical signals with wavelengths in at least part of the microwave/millimeter wave range, said interconnection network comprising an oxidizing metal with an oxidized surface, and further comprising an array of non-oxidizing conductive pads on said oxidizing metal at the bump locations, with said bumps adhered to respective pads, said oxidizing metal comprising copper and said pads having a nickel/gold structure.

2. A microwave/millimeter wave circuit structure comprising:

a non-ceramic and non-semiconductor dielectric substrate, an electrical interconnection network on said substrate, and a plurality of discrete circuit elements, each of said plurality of discrete circuit elements being flip-chip mounted to said substrate with bumps including solder that electrically contact and mechanically adhere to and align with said interconnection network so that said discrete circuit elements are electrically interconnected by said interconnection network, with spacings between the interconnected circuit elements compatible with electrical signals with wavelengths in at least part of the microwave/millimeter range, wherein said dielectric substrate is less than approximately 600 micrometers thick, further comprising a stiffening substrate adhered to said dielectric substrate.

3. The circuit structure of claim 2, wherein at least some of said discrete circuit elements are electrically connected and mechanically adhered to said interconnection network by multiple reflowed solder bumps.

4. A microwave/millimeter wave circuit structure, comprising:

a non-ceramic and non-semiconductor dielectric substrate, an electrical interconnection network on said substrate, and a plurality of discrete circuit elements flip-chip mounted to said substrate and electrically interconnected by said interconnection network, with spacings between the interconnected circuit elements compatible with electrical signals with wavelengths in at least part of the microwave/millimeter wave range, said structure comprising a transceiver circuit on a transceiver substrate, and further comprising an antenna substrate with an antenna formed on one side and adhered back-to-back with the transceiver substrate, said antenna communicating with said transceiver circuit through said substrates.

5. The circuit structure of claim 4, said and antenna substrate having a lower dielectric constant than said transceiver substrate.

6. A microwave/millimeter wave circuit structure comprising:

a non-ceramic and non-semiconductor dielectric substrate, an electrical interconnection network on said substrate, and a plurality of discrete circuit elements, each of said plurality of discrete circuit elements being flip-chip mounted to said substrate with bumps including solder that electrically contact and mechanically adhere to and align with said interconnection network so that said discrete circuit elements are electrically interconnected by said interconnection network, with spacings between the interconnected circuit elements compatible with electrical signals with wavelengths in at least part of the microwave/millimeter range, wherein said substrate is formed from a low-loss plastic material.

* * * * *